United States Patent
Tzu

(10) Patent No.: US 11,380,646 B2
(45) Date of Patent: Jul. 5, 2022

(54) MULTI-SIDED COOLING SEMICONDUCTOR PACKAGE AND METHOD OF MANUFACTURING THE SAME

(71) Applicant: Lite-On Semiconductor Corporation, Hsinchu (TW)

(72) Inventor: Chung Hsing Tzu, Hsinchu (TW)

(73) Assignee: Life-On Semiconductor Corporation, Taipei (TW)

( * ) Notice: Subject to any disclaimer, the term of this patent is extended or adjusted under 35 U.S.C. 154(b) by 2 days.

(21) Appl. No.: 17/012,075

(22) Filed: Sep. 4, 2020

(65) Prior Publication Data

US 2021/0358876 A1    Nov. 18, 2021

Related U.S. Application Data

(60) Provisional application No. 63/025,167, filed on May 14, 2020, provisional application No. 63/028,574, filed on May 22, 2020.

(51) Int. Cl.
*H01L 23/00* (2006.01)
*H01L 25/07* (2006.01)
(Continued)

(52) U.S. Cl.
CPC .......... *H01L 24/32* (2013.01); *H01L 21/4853* (2013.01); *H01L 23/49833* (2013.01); *H01L 23/5385* (2013.01); *H01L 24/48* (2013.01); *H01L 24/73* (2013.01); *H01L 25/072* (2013.01); *H01L 25/18* (2013.01); *H01L 23/3735* (2013.01); *H01L 23/49811* (2013.01); *H01L 2224/26175* (2013.01); *H01L 2224/32238* (2013.01); *H01L 2224/33181* (2013.01);
(Continued)

(58) Field of Classification Search
CPC .......... H01L 23/49811; H01L 23/5385; H01L 23/49833; H01L 25/50; H01L 2224/26175; H01L 25/181; H01L 2224/83192; H01L 23/3735; H01L 24/32; H01L 24/73; H01L 25/071; H01L 24/48; H01L 25/072
See application file for complete search history.

(56) References Cited

U.S. PATENT DOCUMENTS 9,589,922 B2    3/2017   Neugirg et al.
9,997,437 B2    6/2018   Ikeda
(Continued)

*Primary Examiner* — Jasmine J Clark
(74) *Attorney, Agent, or Firm* — JCIPRNET

(57) ABSTRACT

A multi-sided cooling semiconductor package includes a first substrate, a second substrate, semiconductor chips disposed between the first substrate and the second substrate, and first metal preforms. The first substrate includes a upper metal layer, a lower metal layer, and a dielectric plate between the upper metal layer and the lower metal layer. The second substrate also includes a upper metal layer, a lower metal layer, and a dielectric plate between the upper metal layer and the lower metal layer. The first metal preforms are disposed between the first substrate and the semiconductor chips and between the second substrate and the semiconductor chips. A first part of the first metal preforms is in direct contact with the upper metal layer of the first substrate, and a second part of the first metal preforms is in direct contact with the lower metal layer of the second substrate.

39 Claims, 11 Drawing Sheets

(51) Int. Cl.
*H01L 25/18* (2006.01)
*H01L 23/498* (2006.01)
*H01L 23/538* (2006.01)
*H01L 21/48* (2006.01)
*H01L 23/373* (2006.01)

(52) U.S. Cl.
CPC ............ *H01L 2224/48105* (2013.01); *H01L 2224/48225* (2013.01); *H01L 2224/73215* (2013.01); *H01L 2224/73265* (2013.01); *H01L 2224/83192* (2013.01); *H01L 2224/83815* (2013.01)

(56) References Cited

U.S. PATENT DOCUMENTS

| | | |
|---|---|---|
| 10,211,133 B2 | 2/2019 | Grassmann et al. |
| 10,825,774 B2 * | 11/2020 | Oh .................... H01L 23/5389 |
| 2019/0371703 A1 | 12/2019 | Matsuzaki et al. |
| 2021/0217681 A1 * | 7/2021 | Qin .................... H01L 23/3735 |

* cited by examiner (1)         (2)         (3)

MULTI-SIDED COOLING SEMICONDUCTOR PACKAGE AND METHOD OF MANUFACTURING THE SAME

CROSS-REFERENCE TO RELATED APPLICATION

This application claims the priority benefit of U.S. provisional application Ser. No. 63/025,167, filed on May 14, 2020, and U.S. provisional application Ser. No. 63/028,574, filed on May 22, 2020. The entirety of each of the above-mentioned patent applications is hereby incorporated by reference herein and made a part of this specification.

BACKGROUND

Technical Field

The disclosure relates to a cooling semiconductor package, and particularly relates to a multi-sided cooling semiconductor package and method of manufacturing the same.

Description of Related Art

Double side cooling is a promising technique for heat control of semiconductor package, which dissipates heat as generated by semiconductor chips 100 through lower and upper substrates 102 and 104, as illustrated in FIG. 1.

In FIG. 1, solder pastes are used in connecting, physically and electrically, components such as the semiconductor chips 100 to the substrate 102, a lead frame 108 to the substrate 102, and the semiconductor chips 100 to wire bonds (not shown). The solder pastes, while in molten state, could impose a risk of contamination due to overflow caused by compressing. Furthermore, the unevenness of solder joints 106 formed by solder pastes could result in tilting of the semiconductor chips 100 and thereby generating mechanical stress.

Moreover, in FIG. 1, a spacer 110 is employed between the semiconductor chips 100 and the metal layer of the upper substrate 104 so as to connect the same, and the solder joints 106 are respectively applied to therebetween. Such stacking structure could result in adverse impact due to the thermal stress induced by various components with different thermal expansion coefficient.

SUMMARY

The disclosure provides a multi-sided cooling semiconductor package to alleviate thermal stress and have better control of the spread of solder, thereby preventing from contamination and chip tilting.

The disclosure further provides a method of manufacturing multi-sided cooling semiconductor package being low cost and highly compatible to existing process.

The disclosure provides another multi-sided cooling semiconductor package which can enhance the robustness of the package.

The disclosure provides yet another multi-sided cooling semiconductor package without bonding wires and spacers.

The multi-sided cooling semiconductor package of the disclosure includes a first substrate, a second substrate, a plurality of semiconductor chips, and a plurality of first metal preforms. The first substrate includes at least a upper metal layer, a lower metal layer, and a dielectric plate between the upper metal layer and the lower metal layer. The second substrate includes at least a upper metal layer, a lower metal layer, and a dielectric plate between the upper metal layer and the lower metal layer. The semiconductor chips are disposed between the first substrate and the second substrate, and the first metal preforms are disposed between the first substrate and the semiconductor chips and between the second substrate and the semiconductor chips. A first part of the first metal preforms is in direct contact with the upper metal layer of the first substrate.

In an embodiment of the disclosure, the first substrate and the second substrate include direct bond copper (DBC) substrates.

In an embodiment of the disclosure, the first metal preforms are arranged in a matrix, a diagonal spot, or a square.

In an embodiment of the disclosure, the multi-sided cooling semiconductor package further includes a first solder disposed in a space between the semiconductor chips and the upper metal layer of the first substrate or between the semiconductor chips and the first part of the first metal preforms.

In an embodiment of the disclosure, a second part of the first metal preforms is in direct contact with the lower metal layer of the second substrate.

In an embodiment of the disclosure, the multi-sided cooling semiconductor package further includes a second solder disposed in a space between the semiconductor chips and the lower metal layer of the second substrate or between the semiconductor chips and the second part of the first metal preforms.

In an embodiment of the disclosure, the multi-sided cooling semiconductor package further includes interconnection parts disposed between the first substrate and the second substrate and spaced apart form the semiconductor chips.

In an embodiment of the disclosure, the interconnection parts are coupled to the upper metal layer of the first substrate and the lower metal layer of the second substrate by a third solder.

In an embodiment of the disclosure, the interconnection parts are coupled to the lower metal layer of the second substrate by a third solder and spaced apart from the upper metal layer of the first substrate.

In an embodiment of the disclosure, the multi-sided cooling semiconductor package further includes second metal preforms disposed between the interconnection parts and one of the lower metal layer of the second substrate and the upper metal layer of the first substrate.

In an embodiment of the disclosure, the multi-sided cooling semiconductor package further includes second metal preforms disposed between the interconnection parts and the lower metal layer of the second substrate and between the interconnection parts and the upper metal layer of the first substrate.

The method of manufacturing multi-sided cooling semiconductor package of the disclosure includes providing a first substrate and a second substrate first, wherein the first substrate includes a upper metal layer, a lower metal layer, and a dielectric plate between the upper metal layer and the lower metal layer, and the second substrate includes a upper metal layer, a lower metal layer, and a dielectric plate between the upper metal layer and the lower metal layer. First metal preforms are formed on the first substrate and the second substrate, wherein a first part of the first metal preforms is in direct contact with the upper metal layer of the first substrate. Solders are applied on the first part of the first metal preforms, and semiconductor chips are placed on the first part of first metal preforms. A first solder reflow process is performed, and then the first substrate and the second substrate are laminated.

In another embodiment of the disclosure, the step of forming the first metal preforms further includes forming first leads to connect the first substrate and second leads to connect the second substrate.

In another embodiment of the disclosure, the method of forming the first leads and the second leads includes ultrasonic compression bonding.

In another embodiment of the disclosure, the method of forming the first metal preforms includes ultrasonic compression bonding.

In another embodiment of the disclosure, the first substrate and the second substrate include direct bond copper (DBC) substrates.

In another embodiment of the disclosure, before the first solder reflow process, the method further includes placing interconnection parts on the upper metal layer of the first substrate or on the lower metal layer of the second substrate, and the interconnection parts are spaced apart form the semiconductor chips.

In another embodiment of the disclosure, after laminating the first substrate and the second substrate, the method further includes performing a second solder reflow process under vacuum.

In another embodiment of the disclosure, a second part of the first metal preforms is in direct contact with the lower metal layer of the second substrate, and the step of forming the first metal preforms further includes forming second metal preforms on the second substrate for connecting with the interconnection parts.

In another embodiment of the disclosure, after laminating the first substrate and the second substrate, the method further includes molding the semiconductor chips, the first substrate and the second substrate.

The another multi-sided cooling semiconductor package of the disclosure includes a first direct bond copper (DBC) substrate, a second DBC substrate disposed on the first DBC substrate, semiconductor chips disposed between the first DBC substrate and the second DBC substrate, first metal preforms, and metal bonding wires. The first metal preforms are disposed between the first substrate and the semiconductor chips and between the second substrate and the semiconductor chips, wherein a first part of the first metal preforms is in direct contact with an upper metal layer of the first DBC substrate. The metal bonding wires connect at least one of the semiconductor chips to the upper metal layer of the first DBC substrate.

In further another embodiment of the disclosure, the first metal preforms are arranged in a matrix, a diagonal spot, or a square.

In further another embodiment of the disclosure, the multi-sided cooling semiconductor package further includes a first solder disposed in a space between the semiconductor chips and the upper metal layer of the first DBC substrate or between the semiconductor chips and the first part of the first metal preforms.

In further another embodiment of the disclosure, a second part of the first metal preforms is in direct contact with the lower metal layer of the second DBC substrate.

In further another embodiment of the disclosure, the multi-sided cooling semiconductor package further includes a second solder disposed in a space between the semiconductor chips and the lower metal layer of the second DBC substrate or between the semiconductor chips and the second part of the first metal preforms.

In further another embodiment of the disclosure, the multi-sided cooling semiconductor package further includes interconnection parts disposed between the first DBC substrate and the second DBC substrate and spaced apart form the semiconductor chips.

In further another embodiment of the disclosure, the interconnection parts are coupled to the upper metal layer of the first DBC substrate and the lower metal layer of the second DBC substrate by a third solder.

In further another embodiment of the disclosure, the multi-sided cooling semiconductor package further includes second metal preforms disposed between the interconnection parts and one of the lower metal layer of the second DBC substrate and the upper metal layer of the first DBC substrate.

In further another embodiment of the disclosure, the multi-sided cooling semiconductor package further includes second metal preforms disposed between the interconnection parts and the lower metal layer of the second DBC substrate and between the interconnection parts and the upper metal layer of the first DBC substrate.

The yet another multi-sided cooling semiconductor package of the disclosure includes a first direct bond copper (DBC) substrate, a second DBC substrate, semiconductor chips, and first metal preforms. The first DBC substrate has an upper metal layer consisting of first disconnected portions, and the second DBC substrate has a lower metal layer consisting of second disconnected portions. The semiconductor chips are disposed between the first DBC substrate and the second DBC substrate, wherein at least one of the semiconductor chips overlaps with at least three of the first disconnected portions and the second disconnected portions. The first metal preforms are disposed between the first DBC substrate and the semiconductor chips and between the second DBC substrate and the semiconductor chips. A first part of the first metal preforms is in direct contact with the first disconnected portions.

In yet another embodiment of the disclosure, the first metal preforms are arranged in a matrix, a diagonal spot, or a square.

In yet another embodiment of the disclosure, the multi-sided cooling semiconductor package further includes a first solder disposed in a space between the semiconductor chips and the first disconnected portions or between the semiconductor chips and the first part of the first metal preforms.

In yet another embodiment of the disclosure, a second part of the first metal preforms is in direct contact with the second disconnected portions.

In yet another embodiment of the disclosure, the multi-sided cooling semiconductor package further includes a second solder disposed in a space between the semiconductor chips and the second disconnected portions or between the semiconductor chips and the second part of the first metal preforms.

In yet another embodiment of the disclosure, the multi-sided cooling semiconductor package further includes interconnection parts disposed between the first DBC substrate and the second DBC substrate and spaced apart form the semiconductor chips.

In yet another embodiment of the disclosure, the interconnection parts are coupled to the first disconnected portions and the second disconnected portions by a third solder.

In yet another embodiment of the disclosure, the multi-sided cooling semiconductor package further includes second metal preforms disposed between the interconnection parts and one of the first disconnected portions and the second disconnected portions.

In yet another embodiment of the disclosure, the multi-sided cooling semiconductor package further includes second metal preforms disposed between the interconnection parts and the first disconnected portions and between the interconnection parts and the second disconnected portions.

In yet another embodiment of the disclosure, the interconnection parts are coupled to the second disconnected portions, and the first disconnected portions are spaced apart from the interconnection parts.

Based on the above, since the disclosure provides a multi-sided cooling semiconductor package with metal preforms, it can alleviate thermal stress and maintain excellent performances, e.g., heat dissipation, package size, etc. The metal preforms in the multi-sided cooling semiconductor package preforms allow semiconductor chips to be disposed evenly on DBC substrate and provide better control of the spread of solder, and thus free from contamination and chips tilting. Moreover, the metal preforms in the multi-sided cooling semiconductor package can provide better control of package thickness and thus enhance package robustness. In addition, the disclosure involves only few steps of simple modification from the existing process and thus is highly compatible thereto and not costly.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
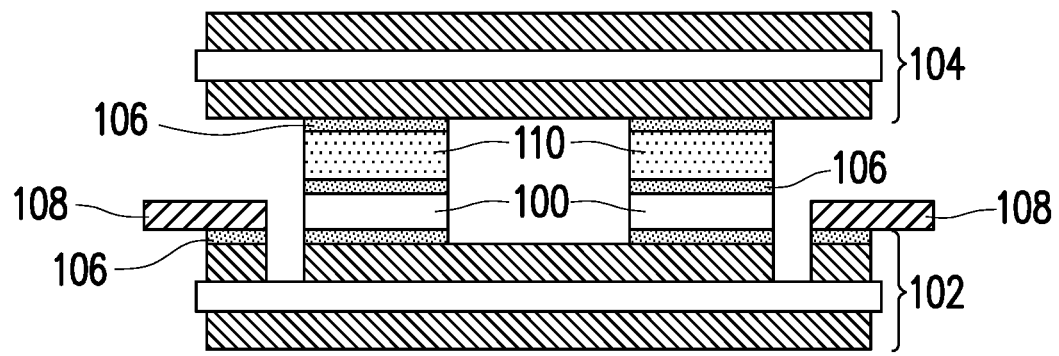
FIG. 1 is a schematic side view of a conventional double-sided cooling semiconductor package.

Referring to the embodiments below and the accompanied drawings for a sufficient understanding of the disclosure. However, the disclosure may be implemented in many other different forms and should not be construed as limited to the embodiments described hereinafter. In the drawings, for clarity, the elements and relative dimensions thereof may not be scaled. For easy understanding, the same elements in the following embodiments will be denoted by the same reference numerals.

Figure 2A:
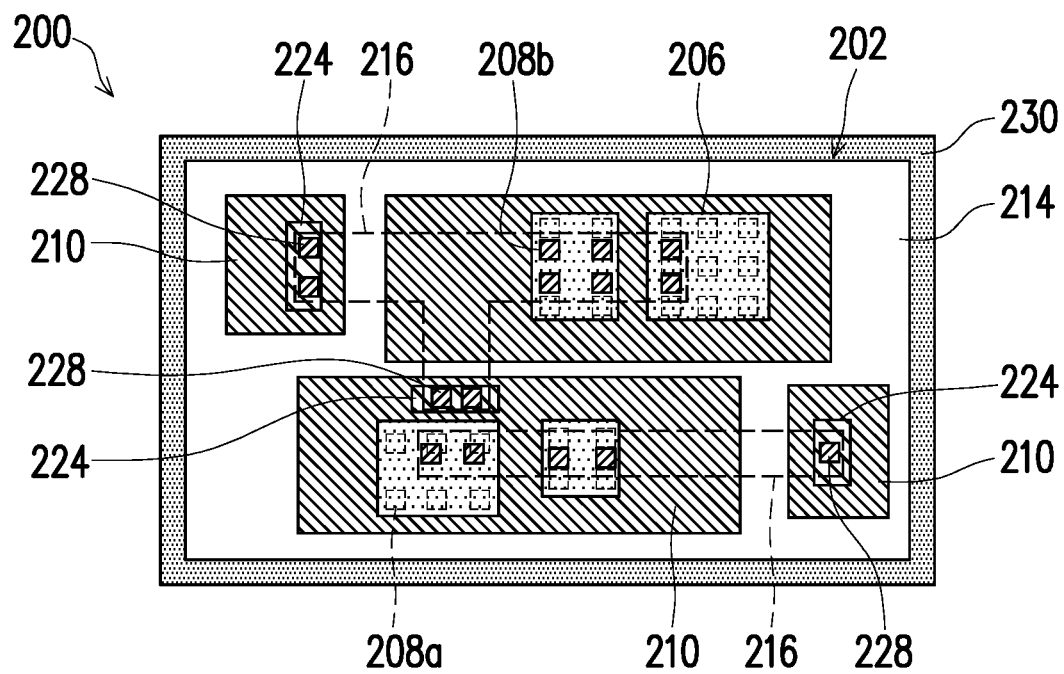
FIG. 2A is a schematic top view of a multi-sided cooling semiconductor package according to a first embodiment of the disclosure.
Figure 2B:
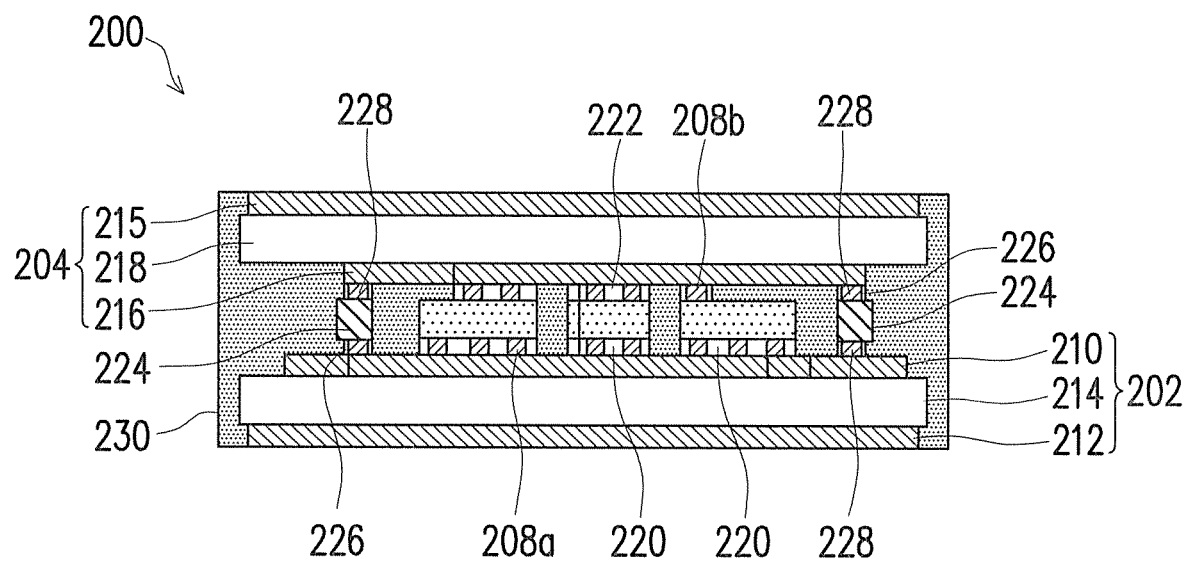
FIG. 2B is a schematic side view of the multi-sided cooling semiconductor package of FIG. 2A.

FIG. 2A is a schematic top view of a multi-sided cooling semiconductor package according to a first embodiment of the disclosure. FIG. 2B is a schematic side view of the multi-sided cooling semiconductor package of FIG. 2A. Herein, the side view is from the page bottom toward the page top of FIG. 2A.

Referring to FIGS. 2A and 2B, the multi-sided cooling semiconductor package 200 includes a first substrate 202, a second substrate 204, a plurality of semiconductor chips 206, and a plurality of first metal preforms 208a, 208b. The first substrate 202 includes at least a upper metal layer 210, a lower metal layer 212, and a dielectric plate 214 between the upper metal layer 210 and the lower metal layer 212. The second substrate 204 includes at least a upper metal layer 215, a lower metal layer 216, and a dielectric plate 218 between the upper metal layer 215 and the lower metal layer 216. The semiconductor chips 206 are disposed between the first substrate 202 and the second substrate 204, and each of the semiconductor chips 206 is, for example, an IGBT, a MOSFET, a FRD (fast recovery diode), or a wide band gap-based chip. In addition, the semiconductor chips 206 may be Si-based chip, SiC-based chip, etc. The first metal preforms 208a are disposed between the first substrate 202 and the semiconductor chips 206, and the first metal preforms 208b are disposed between the second substrate 204 and the semiconductor chips 206. A first part of the first metal preforms 208a is in direct contact with the upper metal layer 210 of the first substrate 202, and a second part of the first metal preforms 208b is in direct contact with the lower metal layer 216 of the second substrate 204. In one embodiment, the first substrate 202 and the second substrate 204 include direct bond copper (DBC) substrates, for example.

Figure 3:
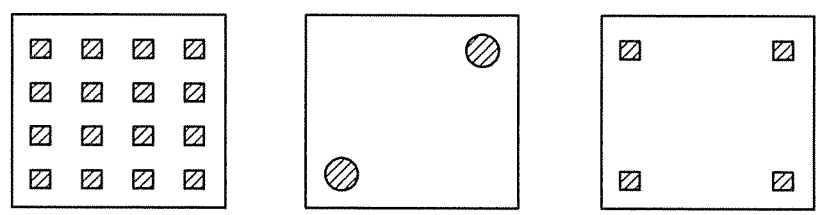
FIG. 3 shows a schematic top view of three types of the first metal preforms in the first embodiment.

FIG. 3 shows a schematic top view of three types of the first metal preforms 208a, 208b. In FIG. 3—(1), the first metal preforms marked by oblique lines are arranged in a matrix. In FIG. 3—(2), the first metal preforms marked by oblique lines are arranged in a diagonal spot. In FIG. 3—(3), the first metal preforms marked by oblique lines are arranged in a square. However, the disclosure is not limited thereto.

Referring to FIG. 2B again, the multi-sided cooling semiconductor package 200 may further include a first solder 220 disposed in a space between the semiconductor chips 206 and the upper metal layer 210 of the first substrate 202. In another embodiment, the first solder 220 may be disposed in a space between the semiconductor chips 206 and the first part of the first metal preforms 208a. In addition, the multi-sided cooling semiconductor package 200 may further includes a second solder 222 disposed in a space between the semiconductor chips 206 and the lower metal layer 216 of the second substrate 204. In another embodiment, the second solder 222 may be disposed in a space between the semiconductor chips 206 and the second part of the first metal preforms 208b.

Referring to FIGS. 2A and 2B, the multi-sided cooling semiconductor package 200 may further includes interconnection parts 224 disposed between the first substrate 202 and the second substrate 204 and spaced apart form the semiconductor chips 206. In this embodiment, the interconnection parts 224 are coupled to the upper metal layer 210 of the first substrate 202 and the lower metal layer 216 of the second substrate 204 by a third solder 226. In addition, the multi-sided cooling semiconductor package 200 may further includes second metal preforms 228 disposed between the interconnection parts 224 and the lower metal layer 216 of the second substrate 204 and between the interconnection parts 224 and the upper metal layer 210 of the first substrate 202. However, the disclosure is not limited thereto; in another embodiment, the second metal preforms 228 may be disposed between the interconnection parts 224 and one of the lower metal layer 216 of the second substrate 204 and the upper metal layer 210 of the first substrate 202, or the second metal preforms 228 are omitted. The second metal preforms 228 can be arranged in a matrix, a diagonal spot, or a square. The second metal preforms 228 also provide better control of the spread of the third solder 226 to avoid solder contamination and improve flatness of the multi-sided cooling semiconductor package 200. The thickness of (first and second) metal preforms lies in a range of from 0.1 mm to 3 mm, for example, and the thickness of the interconnection parts lies in a range of from 3 mm to 6 mm. In one embodiment, the thickness of the first metal preforms 208a and 208b may be 0.5 mm, the thickness of the second metal preforms 228 may be 0.5 mm, and the thickness of the interconnection parts 224 may be 5.5 mm. Moreover, a molding compound 230 can be utilized to encapsulate the above structures.

Figure 4A:
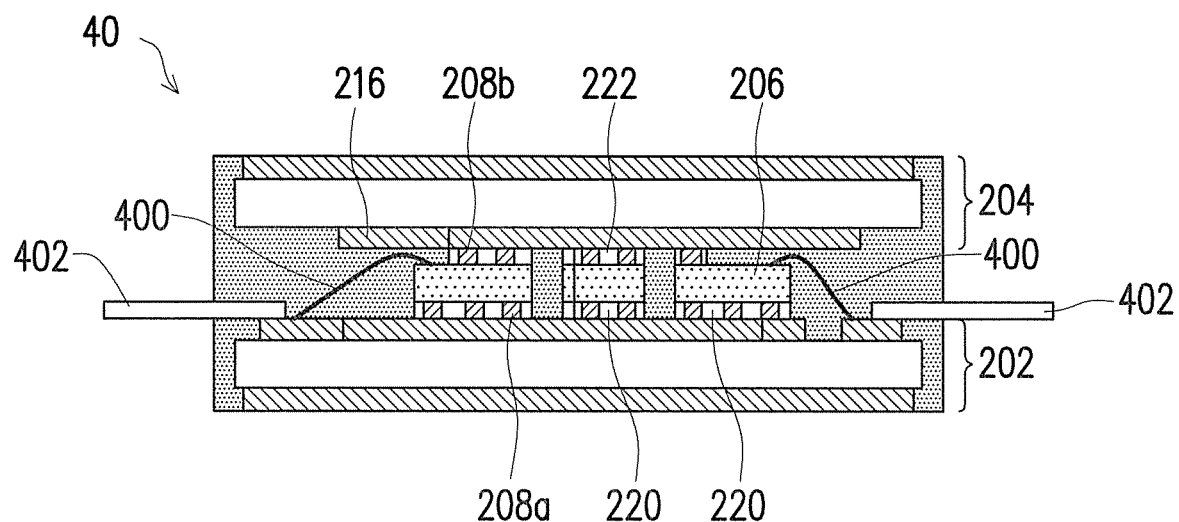
FIG. 4A is a schematic side view of a multi-sided cooling semiconductor package according to a second embodiment of the disclosure.
Figure 4B:
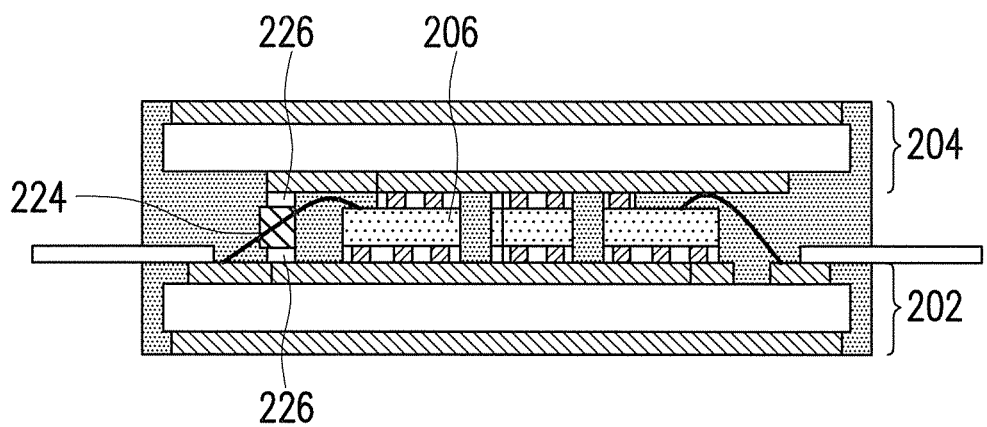
FIG. 4B is a schematic side view of another multi-sided cooling semiconductor package of the second embodiment.
Figure 4C:
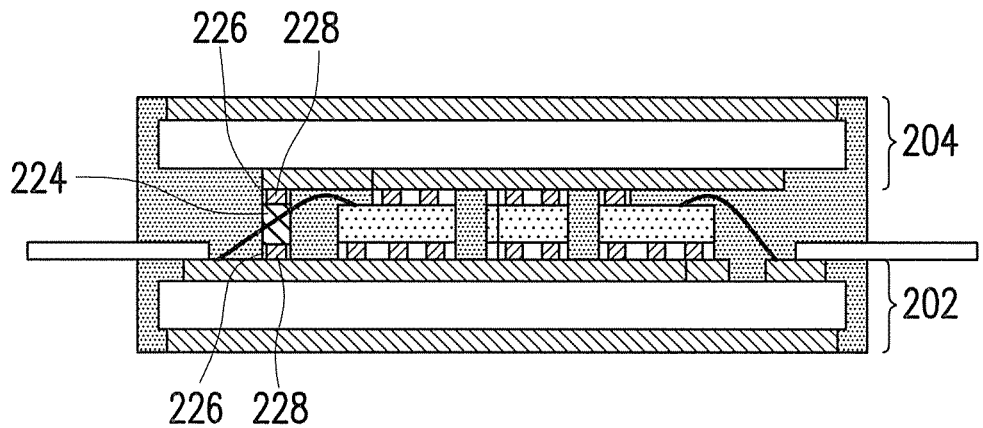
FIG. 4C is a schematic side view of yet another multi-sided cooling semiconductor package of the second embodiment.

FIG. 4A, FIG. 4B, and FIG. 4C are schematic side views of different multi-sided cooling semiconductor packages according to a second embodiment of the disclosure, wherein the reference symbols used in the first embodiment are used to equally represent the same or similar devices. The description of the same components can be derived from the first embodiment, and will not be repeated here.

Referring to FIG. 4A, the multi-sided cooling semiconductor package 40 includes a first direct bond copper (DBC) substrate 202, a second DBC substrate 204 disposed on the first DBC substrate 202, semiconductor chips 206 disposed between the first DBC substrate 202 and the second DBC substrate 204, first metal preforms 208a and 208b, and metal bonding wires 400. The metal bonding wires 400 connect at least one of the semiconductor chips 206 to the upper metal layer 210 of the first DBC substrate 202. In the second embodiment, a first solder 220 is disposed in a space between the semiconductor chips 206 and the upper metal layer 210, and a second solder 222 is disposed in a space between the semiconductor chips 206 and the lower metal layer 216 of the second substrate 204. In addition, there are first leads 402 for connecting the upper metal layer 210 of the first substrate 202.

Referring to FIG. 4B, the difference between FIG. 4A is an interconnection part 224 disposed between the first DBC substrate 202 and the second DBC substrate 204. The interconnection part 224 is spaced apart form the semiconductor chips 206, and the interconnection part 224 is coupled to the upper metal layer 210 of the first substrate 202 and the lower metal layer 216 of the second substrate 204 by a third solder 226.

Referring to FIG. 4C, the difference between FIG. 4B is second metal preforms 228 disposed between the interconnection part 224 and the lower metal layer 216 of the second substrate 204 and between the interconnection part 224 and the upper metal layer 210 of the first substrate 202 to provide better control of the spread of the third solder 226.

FIG. 5A to FIG. 5G are plan views showing a process flow of manufacturing a multi-sided cooling semiconductor package according to a third embodiment of the disclosure.

Figure 5A:
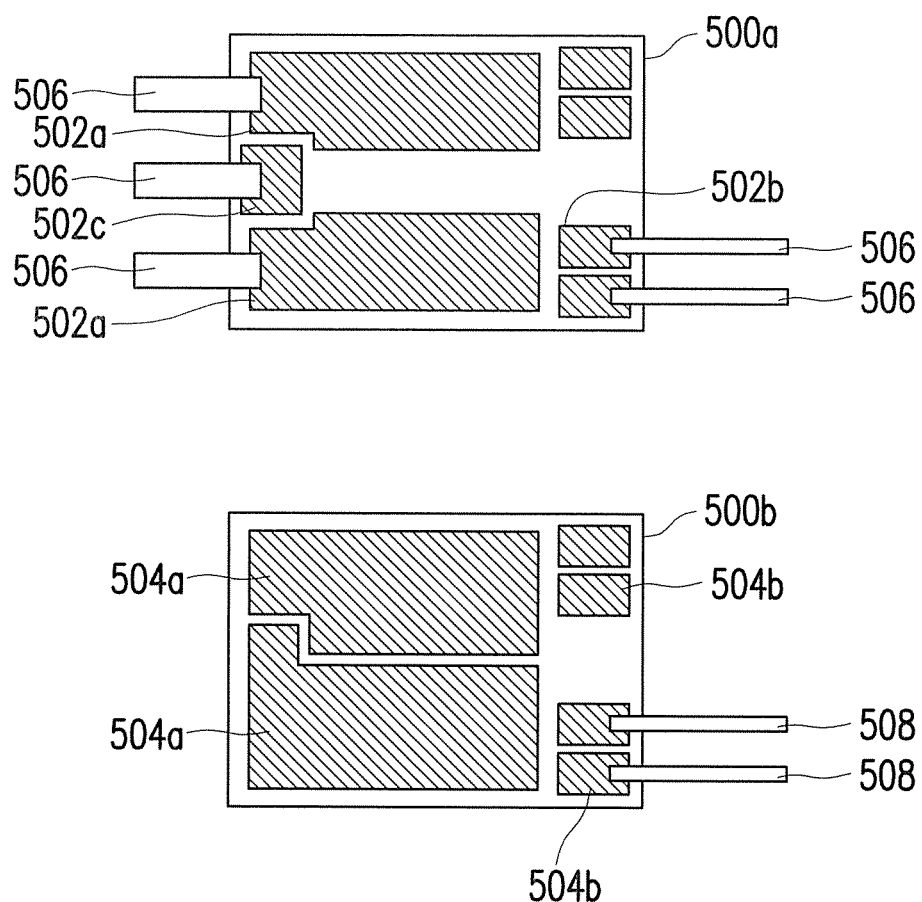
FIG. 5A to FIG. 5G are plan views showing a process flow of manufacturing a multi-sided cooling semiconductor package according to a third embodiment of the disclosure.

First, referring to FIG. 5A, a first DBC substrate 500a and a second DBC substrate 500b are provided. In this embodiment, the first DBC substrate 500a is a lower substrate, and the second DBC substrate 500b is an upper substrate. The first DBC substrate 500a has an upper metal layer consisting of first disconnected portions 502a, 502b and 502c, and the second DBC substrate 500b has a lower metal layer consisting of second disconnected portions 504a and 504b. First leads 506 and second leads 508 are respectively bonded to the first DBC substrate 500a (e.g. the first disconnected portions 502a, 502b and 502c) and the second DBC substrate 500b 504 (e.g. the second disconnected portions 504b) for power transmission.

Figure 5B:
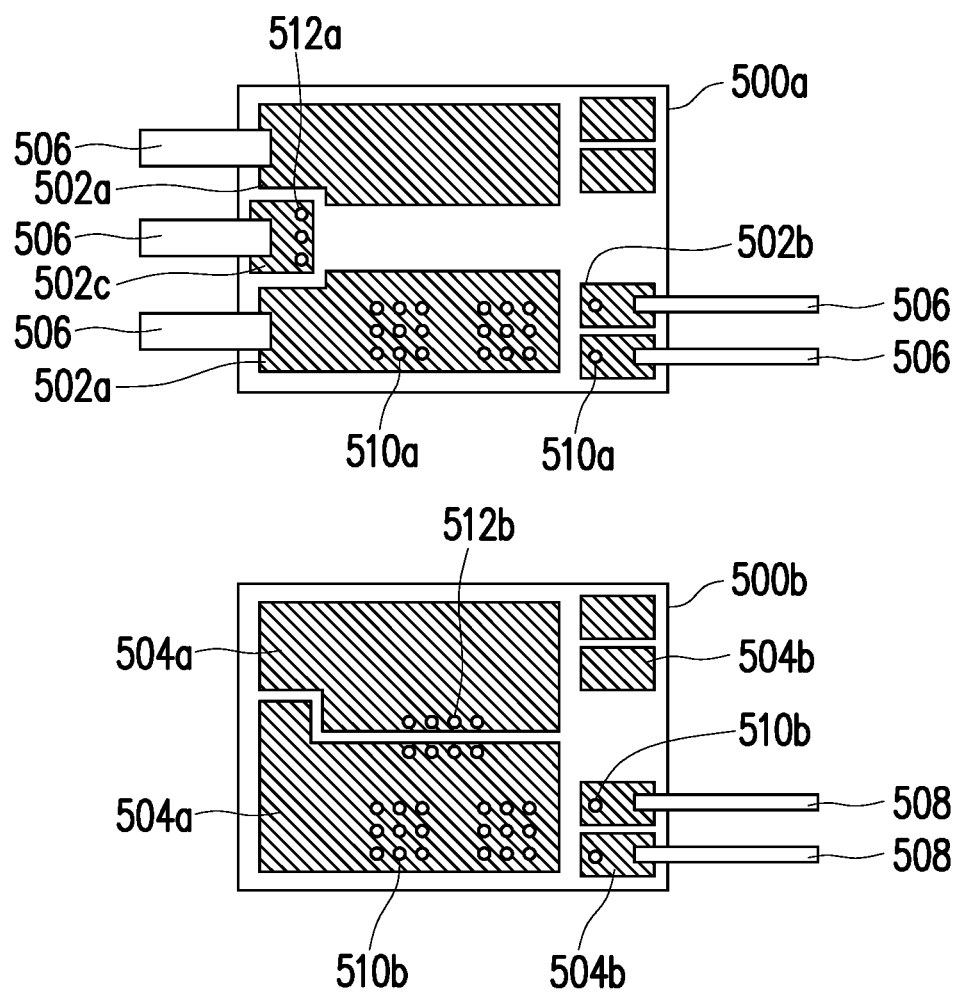

Then, referring to FIG. 5B, first metal preforms 510a and 510b and second metal preforms 512a and 512b are formed by ultrasonic compression bonding (also known as ultrasonic welding) such as thermal ultrasonic compression. A first part of the first metal preforms 510a is in direct contact with the first disconnected portions 502a and 502b, and a second part of the first metal preforms 510b is in direct contact with the second disconnected portions 504a and 504b. The second metal preforms 512a are in direct contact with the first disconnected portion 502c, and the second metal preforms 512b are in direct contact with two of the second disconnected portions 504a.

Figure 5C:
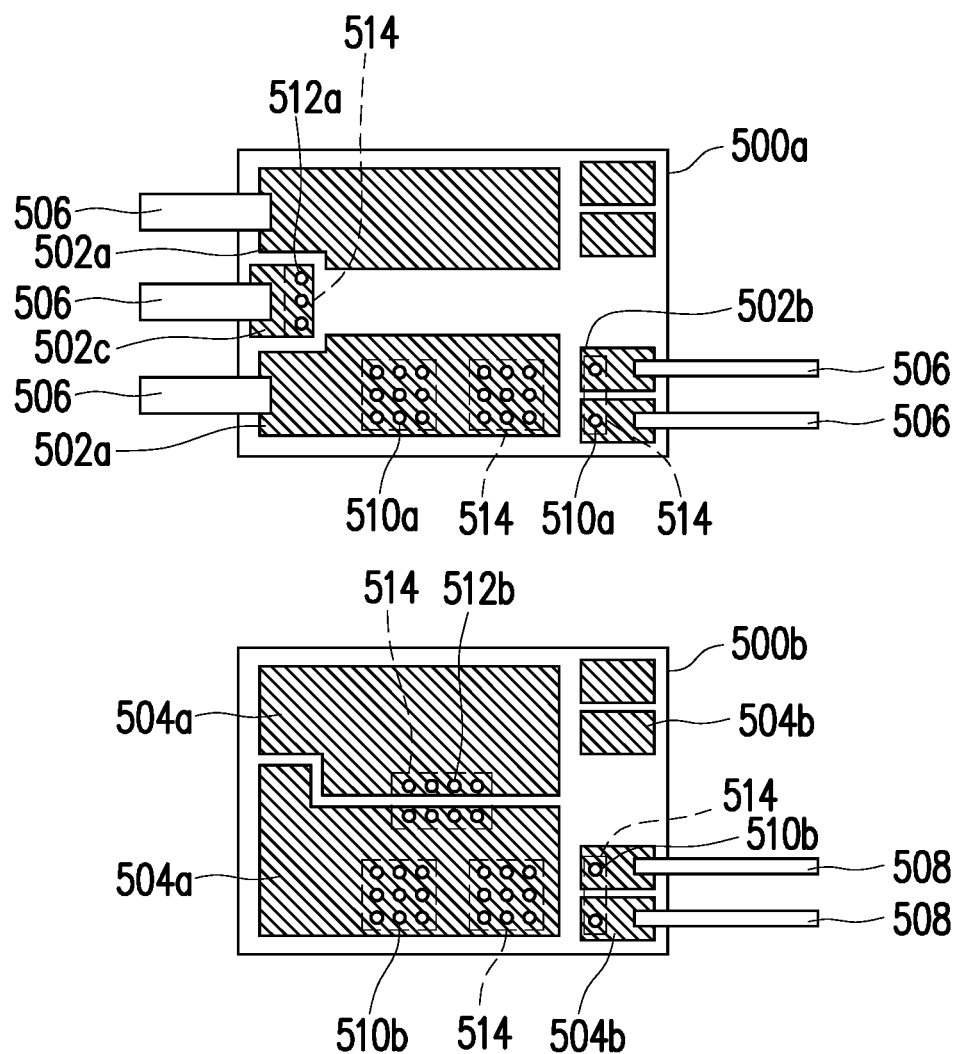

Next, referring to FIG. 5C, first solders 514 are applied on the first metal preforms 510a and 510b and the second metal preforms 512a and 512b.

Figure 5D:
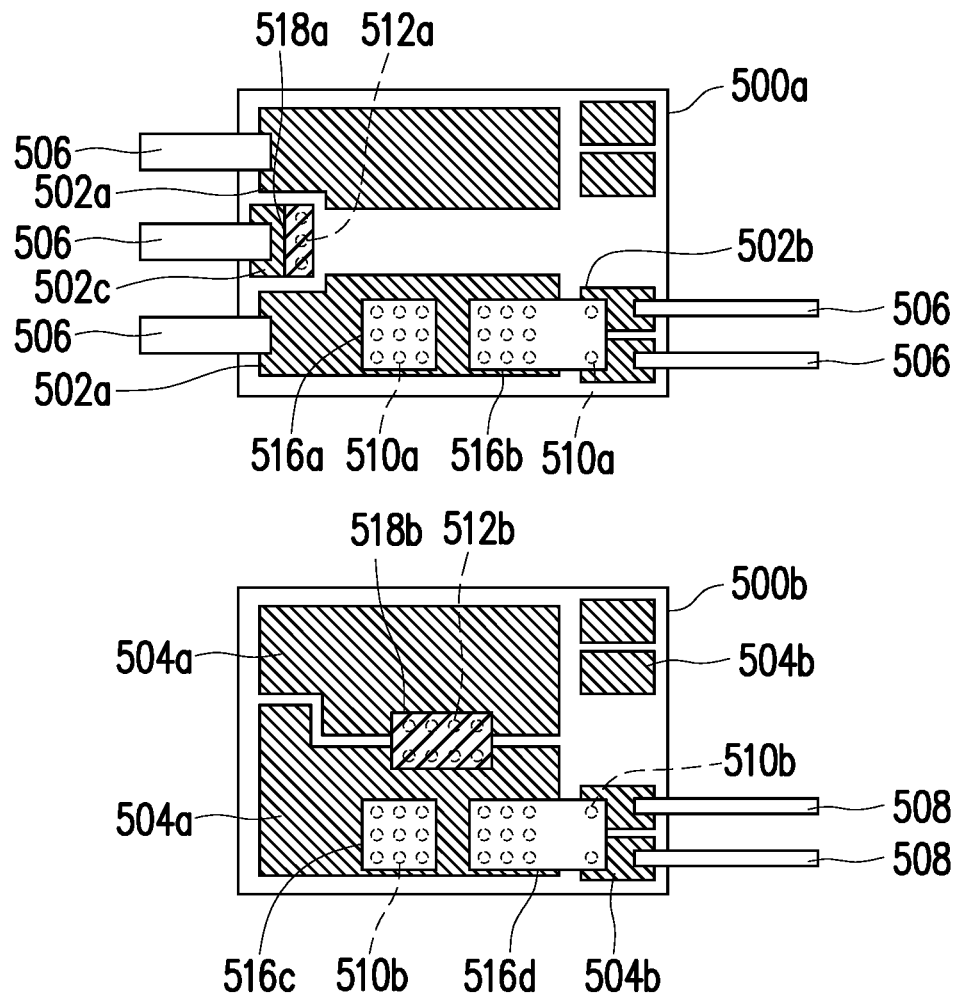

Referring to FIG. 5D, semiconductor chips 516a, 516b, 516c and 516d are placed on the first metal preforms 510a and 510b, and interconnection parts 518a and 518b are respectively placed on the second metal preforms 512a and 512b. Each of the semiconductor chips 516a, 516b, 516c and 516d is, for example, an IGBT, a MOSFET, a FRD (fast recovery diode), or a wide band gap-based chip. In addition, the semiconductor chips 516a, 516b, 516c and 516d may be Si-based chip, SiC-based chip, etc. Thereafter, a first solder reflow process is performed.

Figure 5E:
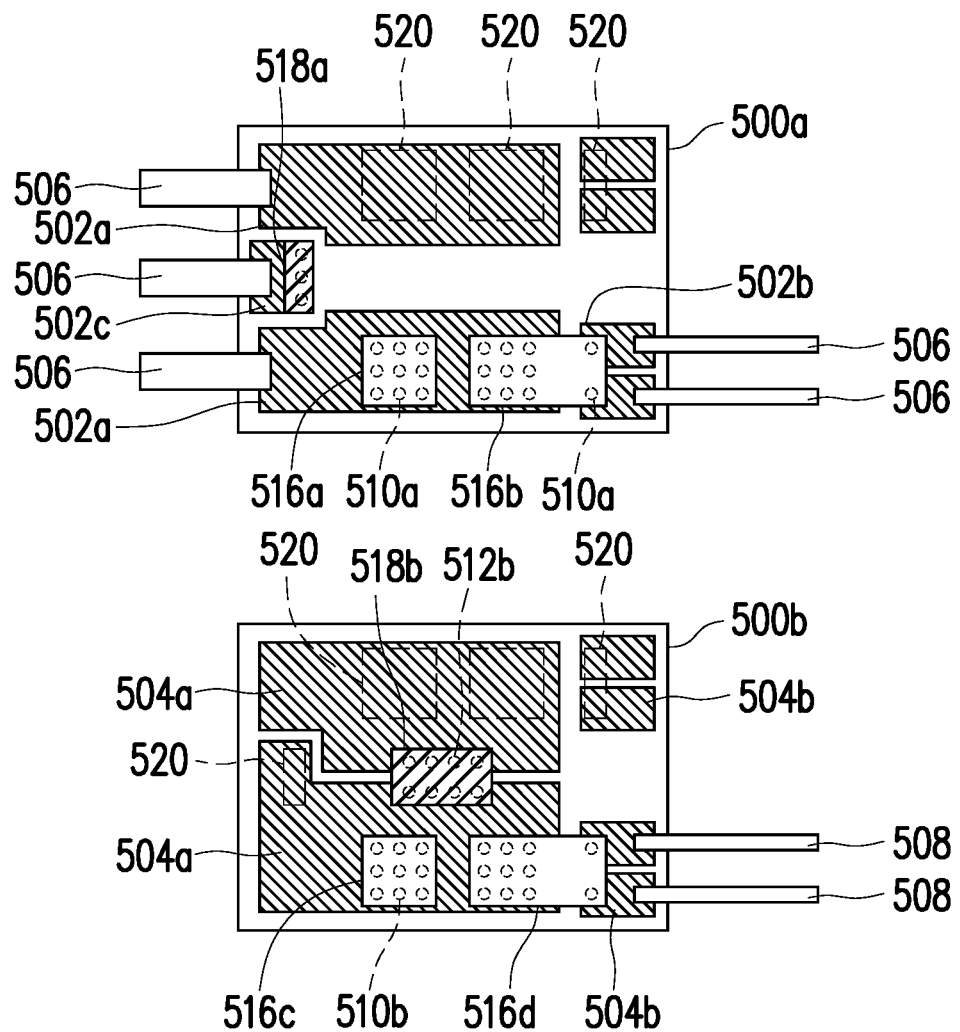

Then, referring to FIG. 5E, second solders 520 are applied on the first disconnected portions 502a and 502b and the second disconnected portions 504a and 504b for subsequently coupling the interconnection part 518a and bonding the semiconductor chips 516a, 516b, 516c and 516d.

Figure 5F:
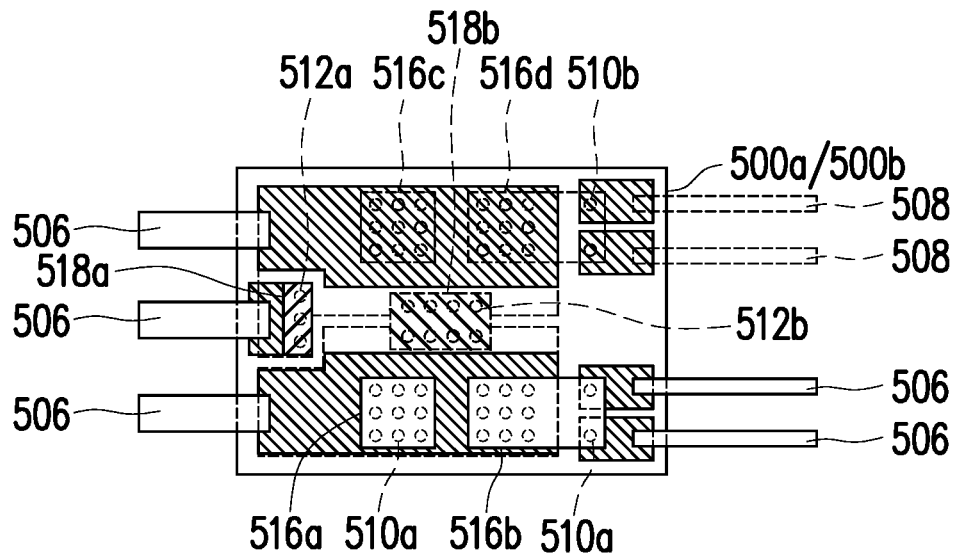

Next, referring to FIG. 5F, the first DBC substrate 500a and the second DBC substrate 500b are laminated, wherein the second DBC substrate 500b and elements formed thereon are shown in dashed lines. After laminating the first DBC substrate 500a and the second DBC substrate 500b, a second solder reflow process is performed under vacuum in order to couple the interconnection part 518a to the second DBC substrate 500b and bond the semiconductor chips 516a, 516b, 516c and 516d between the first DBC substrate 500a and the second DBC substrate 500b.

Figure 5G:
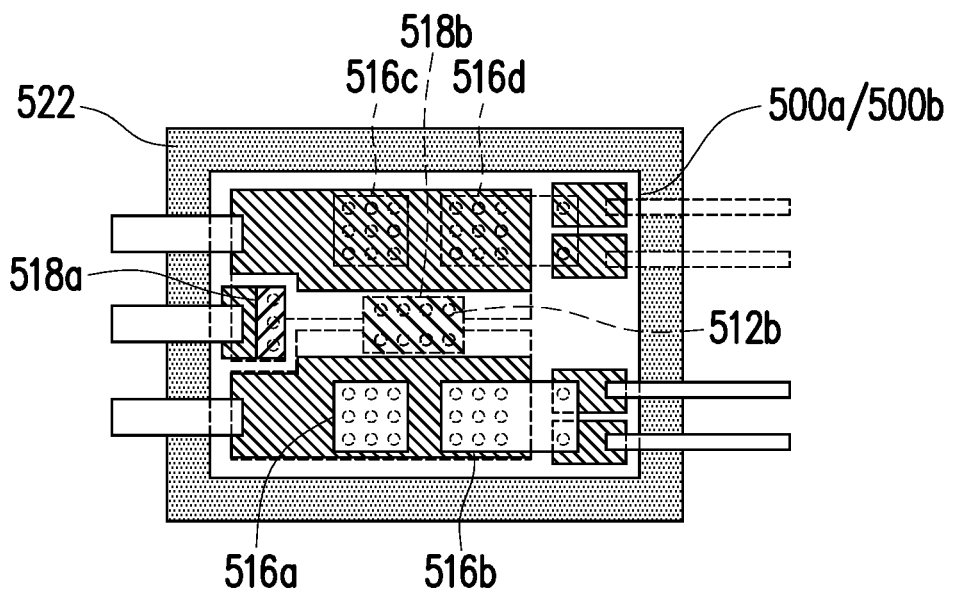

Last, referring to FIG. 5G, the semiconductor chips 516a, 516b, 516c and 516d, the interconnection parts 518a and 518b, the first DBC substrate 500a and the second DBC substrate 500b are encapsulated by a molding compound 522.

Figure 5H:
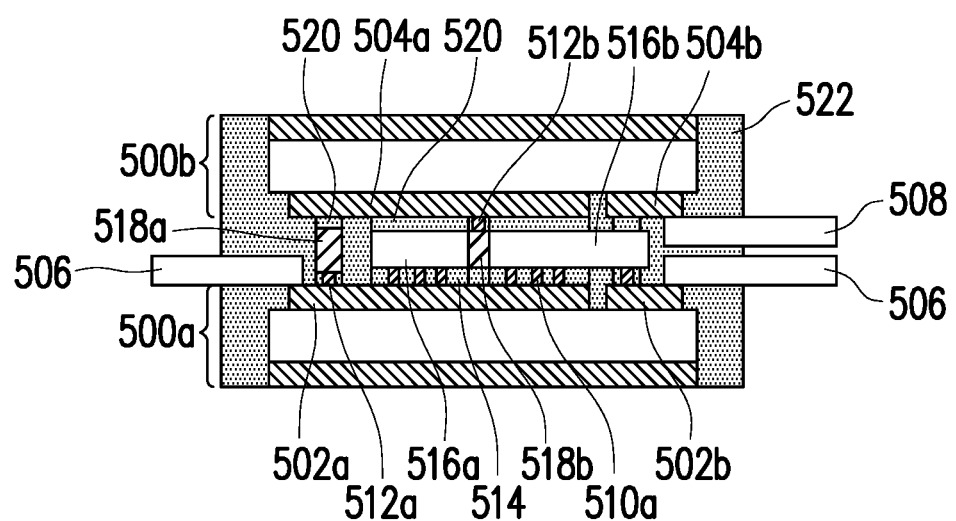
FIG. 5H is a schematic side view of the multi-sided cooling semiconductor package of FIG. 5G.

FIG. 5H is a schematic side view of the multi-sided cooling semiconductor package of FIG. 5G. In FIG. 5H, each of the semiconductor chips overlaps with at least two of the first disconnected portions and the second disconnected portions. For example, if the semiconductor chip 516a has two input/output terminals at opposite surfaces, the semiconductor chip 516a can overlaps with the first disconnected portions 502a and the second disconnected portions 504a; if the semiconductor chip 516b has three input/output terminals such as IGBT, the semiconductor chip 516b can overlaps with the first disconnected portions 502a and 502b and the second disconnected portions 504b.

Figure 6:
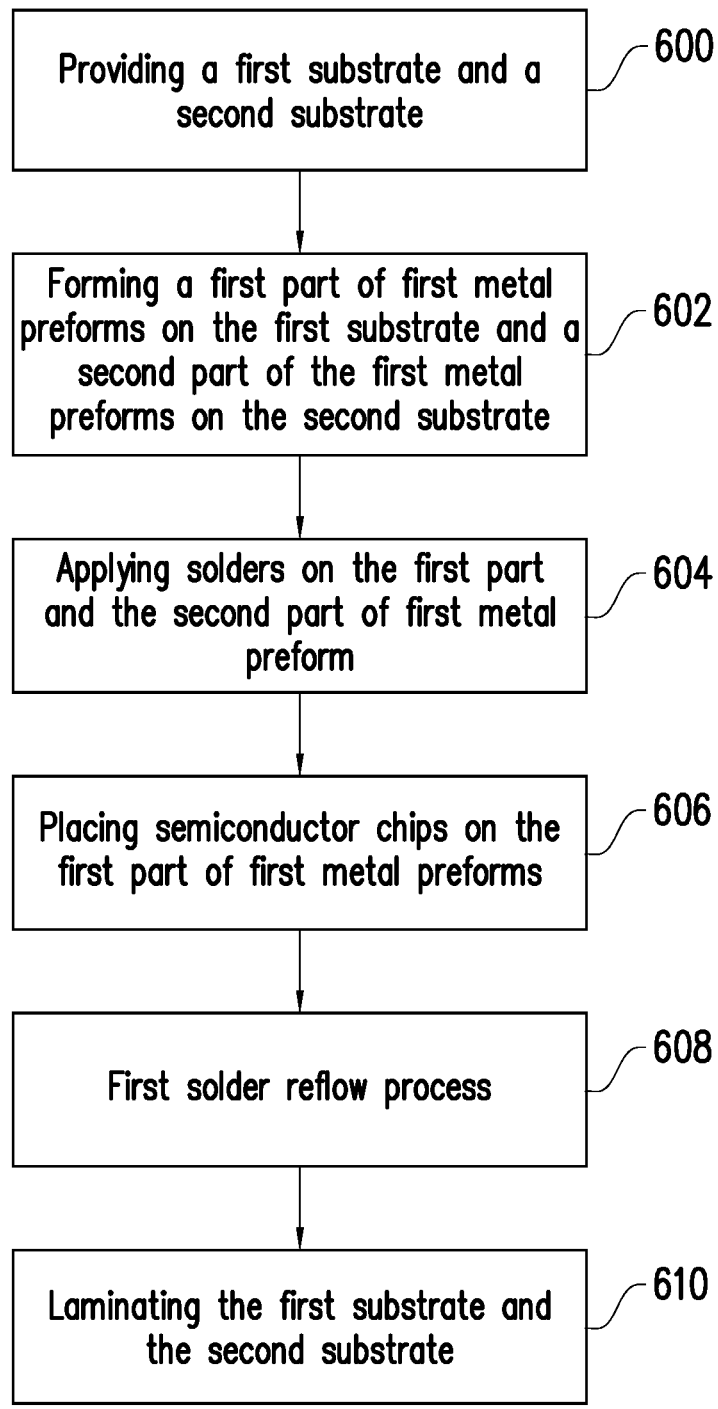
FIG. 6 is a flow diagram illustrating steps for manufacturing a multi-sided cooling semiconductor package according to a fourth embodiment of the disclosure.

FIG. 6 is a flow diagram illustrating steps for manufacturing a multi-sided cooling semiconductor package according to a fourth embodiment of the disclosure.

Referring to FIG. 6, the step of manufacturing a multi-sided cooling semiconductor package includes providing a first substrate and a second substrate (Step 600), wherein the first substrate and the second substrate include direct bond copper (DBC) substrates, for example. In one embodiment, the first substrate includes a upper metal layer, a lower metal layer, and a dielectric plate between the upper metal layer and the lower metal layer, and the second substrate includes a upper metal layer, a lower metal layer, and a dielectric plate between the upper metal layer and the lower metal layer.

In the step 602, a first part of first metal preforms is formed on the first substrate and a second part of the first metal preforms is formed on the second substrate, wherein the first part of the first metal preforms is in direct contact with the upper metal layer of the first substrate, and the second part of the first metal preforms is in direct contact with the lower metal layer of the second substrate. The method of forming the first part and the second part of the first metal preforms includes, for example, ultrasonic compression bonding (also known as ultrasonic welding) such as thermal ultrasonic compression. In another embodiment, during the step 602, by using the process such as ultrasonic compression bonding, first leads and second leads may be formed to connect the first substrate and the second substrate, respectively. That is, the first metal preforms and the first and second leads can be formed at the same time, and the process time is only a few seconds to several tens of seconds. In comparison with the process of conventional double-sided cooling semiconductor package (as shown FIG. 1), the process time for bonding spacers is as least several minutes (including a solder reflow plus vacuum-pumping).

In the step 604, solders are applied on the first part and the second part of the first metal preforms.

In the step 606, semiconductor chips are placed on the first part of first metal preforms. Each of the semiconductor chips is, for example, an IGBT, a MOSFET, a FRD (fast recovery diode), or a wide band gap-based chip. In addition, the semiconductor chips 206 may be Si-based chip, SiC-based chip, etc.

In the step 608, a first solder reflow process is performed. In one embodiment, before the step 608, interconnection parts may be further placed on the lower metal layer of the second substrate or on the lower metal layer of the second substrate, and the interconnection parts are spaced apart form the semiconductor chips.

After the step 608, a wire bonding is performed to from metal bonding wires as shown FIGS. 4A to 4C. Alternatively, the wire bonding is omitted, and a flip chip technique is used to bond the semiconductor chips on the first and second DBC substrates.

In the step 610, the first substrate and the second substrate are laminated. After the step 610, a second solder reflow process may be performed under vacuum, and then molding the semiconductor chips, the first substrate and the second substrate.

In summary, since the multi-sided cooling semiconductor package according to the disclosure has metal preforms directly contacted with the metal layer of the substrate (such as DBC substrate), it can alleviate thermal stress and maintain excellent performances (e.g. heat dissipation, package size, etc) in comparison with solder-only connection. The metal preforms allow the semiconductor chips to be disposed evenly on the substrate and provide better control of the spread of solder, and thus free from contamination and chips tilting. Moreover, the metal preforms can replace the spacers in conventional double-sided cooling semiconductor package, and thus the disclosure not only provides better control of package thickness but also reduces thermal stress due to decrease of heterojunction (no spacers), thereby enhancing package robustness. If the multi-sided cooling semiconductor package is free from wire-bonding process, the stay inductance may be further reduced. In addition, the disclosure involves only few steps of simple modification from the existing process and thus is highly compatible thereto and not costly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A multi-sided cooling semiconductor package, comprising:
   a first substrate, comprising an upper metal layer, a lower metal layer, and a dielectric plate between the upper metal layer and the lower metal layer;
   a second substrate, comprising an upper metal layer, a lower metal layer, and a dielectric plate between the upper metal layer and the lower metal layer;
   a plurality of semiconductor chips disposed between the first substrate and the second substrate; and
   a plurality of first metal preforms disposed between the first substrate and the semiconductor chips and between the second substrate and the semiconductor chips, wherein a first part of the plurality of first metal preforms is in direct contact with the upper metal layer of the first substrate.

2. The multi-sided cooling semiconductor package according to claim 1, wherein the first substrate and the second substrate comprise direct bond copper (DBC) substrates.

3. The multi-sided cooling semiconductor package according to claim 1, wherein the first metal preforms are arranged in a matrix or a square, or arranged at ends of a diagonal.

4. The multi-sided cooling semiconductor package according to claim 1, further comprising a first solder disposed in a space between the semiconductor chips and the upper metal layer of the first substrate or between the semiconductor chips and the first part of the plurality of first metal preforms.

5. The multi-sided cooling semiconductor package according to claim 1, wherein a second part of the plurality of first metal preforms is in direct contact with the lower metal layer of the second substrate.

6. The multi-sided cooling semiconductor package according to claim 5, further comprising a second solder disposed in a space between the semiconductor chips and the lower metal layer of the second substrate or between the semiconductor chips and the second part of the plurality of first metal preforms.

7. The multi-sided cooling semiconductor package according to claim 1, further comprising a plurality of interconnection parts disposed between the first substrate and the second substrate and spaced apart from the semiconductor chips.

8. The multi-sided cooling semiconductor package according to claim 7, wherein the interconnection parts are coupled to the upper metal layer of the first substrate and the lower metal layer of the second substrate by a third solder.

9. The multi-sided cooling semiconductor package according to claim 7, wherein the interconnection parts are coupled to the lower metal layer of the second substrate by a third solder and spaced apart from the upper metal layer of the first substrate.

10. The multi-sided cooling semiconductor package according to claim 7, further comprising a plurality of second metal preforms disposed between the interconnection parts and one of the lower metal layer of the second substrate and the upper metal layer of the first substrate.

11. The multi-sided cooling semiconductor package according to claim 7, further comprising a plurality of second metal preforms disposed between the interconnection parts and the lower metal layer of the second substrate and between the interconnection parts and the upper metal layer of the first substrate.

12. A method of manufacturing multi-sided cooling semiconductor package, comprising:
provinding a first substrate and a second substrate, wherein the first substrate comprises an upper metal layer, a lower metal layer, and a dielectric plate between the upper metal layer and the lower metal layer, and the second substrate comprises an upper metal layer, a lower metal layer, and a dielectric plate between the upper metal layer and the lower metal layer;
forming a plurality of first metal preforms on the first substrate and the second substrate, wherein a first part of the plurality of first metal preforms is in direct contact with the upper metal layer of the first substrate;
applying solders on the first part of the plurality of first metal preforms;
placing a plurality of semiconductor chips on the first part of plurality of first metal preforms;
performing a first solder reflow process; and
laminating the first substrate and the second substrate to each other.

13. The method according to claim 12, wherein the step of forming the first metal preforms, further comprises forming a plurality of first leads to connect the first substrate and a plurality of second leads to connect the second substrate.

14. The method according to claim 13, wherein the method of forming the first leads and the second leads comprises ultrasonic compression bonding.

15. The method according to claim 12, wherein the method of forming the first metal preforms comprises ultrasonic compression bonding.

16. The method according to claim 12, wherein the first substrate and the second substrate comprise direct bond copper (DBC) substrates.

17. The method according to claim 12, wherein before performing the first solder reflow process, further comprises placing a plurality of interconnection parts on the upper metal layer of the first substrate or on the lower metal layer of the second substrate, and the plurality of interconnection parts are spaced apart from the semiconductor chips.

18. The method according to claim 17, wherein after laminating the first substrate and the second substrate to each other, further comprises performing a second solder reflow process under vacuum.

19. The method according to claim 17, wherein a second part of the plurality of first metal preforms is in direct contact with the lower metal layer of the second substrate, and the step of forming the first metal preforms further comprises forming a plurality of second metal preforms on the second substrate for connecting with the interconnection parts.

20. The method according to claim 12, wherein after laminating the first substrate and the second substrate to each other, further comprises molding the semiconductor chips, the first substrate and the second substrate.

21. A multi-sided cooling semiconductor package, comprising:
a first direct bond copper (DBC) substrate;
a second DBC substrate disposed on the first DBC substrate;
a plurality of semiconductor chips disposed between the first DBC substrate and the second DBC substrate;
a plurality of first metal preforms disposed between the first DBC substrate and the semiconductor chips and between the second DBC substrate and the semiconductor chips, wherein a first part of the plurality of first metal preforms is in direct contact with an upper metal layer of the first DBC substrate; and
a plurality of metal bonding wires, connecting at least one of the semiconductor chips to the upper metal layer of the first DBC substrate.

22. The multi-sided cooling semiconductor package according to claim 21, wherein the first metal preforms are arranged in a matrix or a square, or arranged at ends of a diagonal.

23. The multi-sided cooling semiconductor package according to claim 21, further comprising a first solder disposed in a space between the semiconductor chips and the upper metal layer of the first DBC substrate or between the semiconductor chips and the first part of the plurality of first metal preforms.

24. The multi-sided cooling semiconductor package according to claim 21, wherein a second part of the plurality of first metal preforms is in direct contact with the lower metal layer of the second DBC substrate.

25. The multi-sided cooling semiconductor package according to claim 24, further comprising a second solder disposed in a space between the semiconductor chips and the lower metal layer of the second DBC substrate or between the semiconductor chips and the second part of the plurality of first metal preforms.

26. The multi-sided cooling semiconductor package according to claim 21, further comprising a plurality of interconnection parts disposed between the first DBC substrate and the second DBC substrate and spaced apart from the semiconductor chips.

27. The multi-sided cooling semiconductor package according to claim 26, wherein the interconnection parts are coupled to the upper metal layer of the first DBC substrate and the lower metal layer of the second DBC substrate by a third solder.

28. The multi-sided cooling semiconductor package according to claim 26, further comprising a plurality of second metal preforms disposed between the interconnection parts and one of the lower metal layer of the second DBC substrate and the upper metal layer of the first DBC substrate.

29. The multi-sided cooling semiconductor package according to claim 26, further comprising a plurality of second metal preforms disposed between the interconnection parts and the lower metal layer of the second DBC substrate and between the interconnection parts and the upper metal layer of the first DBC substrate.

30. A multi-sided cooling semiconductor package, comprising:
- a first direct bond copper (DBC) substrate having an upper metal layer consisting of first disconnected portions;
- a second DBC substrate disposed on the first DBC substrate, wherein the second DBC substrate has a lower metal layer consisting of second disconnected portions;
- a plurality of semiconductor chips disposed between the first DBC substrate and the second DBC substrate, wherein at least one of the semiconductor chips overlaps with a total of at least three of the first disconnected portions and the second disconnected portions; and
- a plurality of first metal preforms disposed between the first DBC substrate and the semiconductor chips and between the second DBC substrate and the semiconductor chips, wherein a first part of the plurality of first metal preforms is in direct contact with the first disconnected portions.

31. The multi-sided cooling semiconductor package according to claim 30, wherein the first metal preforms are arranged in a matrix or a square, or arranged at ends of a diagonal.

32. The multi-sided cooling semiconductor package according to claim 30, further comprising a first solder disposed in a space between the semiconductor chips and the first disconnected portions or between the semiconductor chips and the first part of the plurality of first metal preforms.

33. The multi-sided cooling semiconductor package according to claim 30, wherein a second part of the plurality of first metal preforms is in direct contact with the second disconnected portions.

34. The multi-sided cooling semiconductor package according to claim 33, further comprising a second solder disposed in a space between the semiconductor chips and the second disconnected portions or between the semiconductor chips and the second part of the plurality of first metal preforms.

35. The multi-sided cooling semiconductor package according to claim 30, further comprising a plurality of interconnection parts disposed between the first DBC substrate and the second DBC substrate and spaced apart from the semiconductor chips.

36. The multi-sided cooling semiconductor package according to claim 35, wherein the interconnection parts are coupled to the first disconnected portions and the second disconnected portions by a third solder.

37. The multi-sided cooling semiconductor package according to claim 35, further comprising a plurality of second metal preforms disposed between the interconnection parts and the first disconnected portions or between the interconnection parts and the second disconnected portions.

38. The multi-sided cooling semiconductor package according to claim 35, further comprising a plurality of second metal preforms disposed between the interconnection parts and the first disconnected portions and between the interconnection parts and the second disconnected portions.

39. The multi-sided cooling semiconductor package according to claim 35, wherein the interconnection parts are coupled to the second disconnected portions, and the first disconnected portions are spaced apart from the interconnection parts.

* * * * *

UNITED STATES PATENT AND TRADEMARK OFFICE
CERTIFICATE OF CORRECTION

PATENT NO. : 11,380,646 B2
APPLICATION NO. : 17/012075
DATED : July 5, 2022
INVENTOR(S) : Chung Hsing Tzu It is certified that error appears in the above-identified patent and that said Letters Patent is hereby corrected as shown below:

On the Title Page

Item (73) Assignee Should Read: Lite-On Semiconductor Corporation, Taipei (TW)

Signed and Sealed this
Twenty-seventh Day of September, 2022

Katherine Kelly Vidal
*Director of the United States Patent and Trademark Office*